United States Patent [19]

Dolazza

[11] Patent Number: 4,573,035
[45] Date of Patent: Feb. 25, 1986

[54] DIGITAL X-RAY SYSTEM

[75] Inventor: Enrico Dolazza, Boston, Mass.

[73] Assignee: Analogic Corporation, Peabody, Mass.

[21] Appl. No.: 634,398

[22] Filed: Jul. 25, 1984

[51] Int. Cl.$^4$ .................... H03M 1/08; H03M 1/70
[52] U.S. Cl. .......................... 340/347 AD; 358/167
[58] Field of Search ................. 340/347 AD; 358/167

[56] References Cited

U.S. PATENT DOCUMENTS

| | | | |
|---|---|---|---|
| 3,585,631 | 6/1971 | McCown | 340/347 AD |
| 4,136,363 | 1/1979 | Saran | 358/261 |
| 4,204,226 | 5/1980 | Mistretta et al. | 358/111 |
| 4,335,311 | 6/1982 | Lutz et al. | 250/409 |
| 4,346,409 | 8/1982 | Ishida et al. | 358/280 |
| 4,367,490 | 1/1983 | Riederer | 358/167 |
| 4,458,267 | 7/1984 | Dolazza | 358/111 |

*Primary Examiner*—L. T. Hix
*Assistant Examiner*—David M. Gray

*Attorney, Agent, or Firm*—Weingarten, Schurgin, Gagnebin & Hayes

[57] ABSTRACT

A radiology system for storing, processing, and displaying two-dimensional image data derived from an x-ray source. A visible x-ray image or sequence of images is scanned to produce a signal representing the intensity of the images, and this signal is encoded to provide a data compressed digital signal which is stored and processed to yield displayed images of enhanced quality in which image sequence and processing intervals may be in real-time. The encoded signal is of a format to reduce the amount of data stored in memory, and temporal and spatial averaging and variable length coding are employed for efficient image data processing. Apparatus is provided for defining a mask image, from which other image data is subtracted to yield an enhanced image. The system can include means for providing a control signal representing the level of radiation absorption by a body, and adjusting the intensity of x-ray radiation in accordance with the absorption level.

2 Claims, 18 Drawing Figures

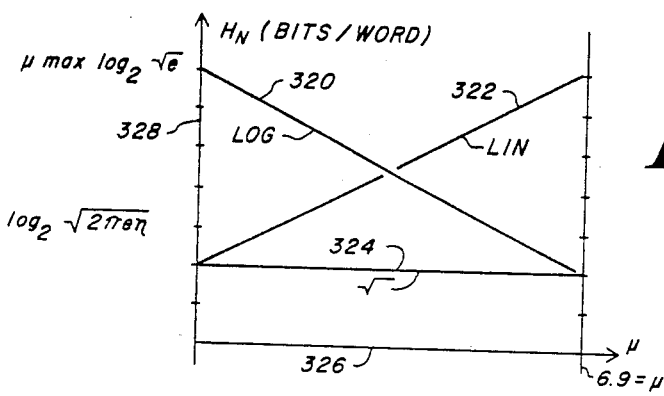
FIG. 5
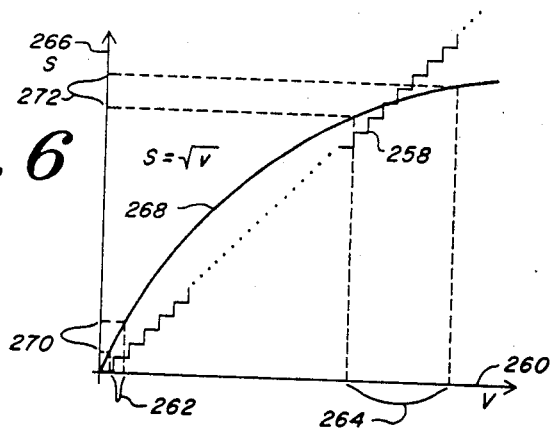
FIG. 6
FIG. 7
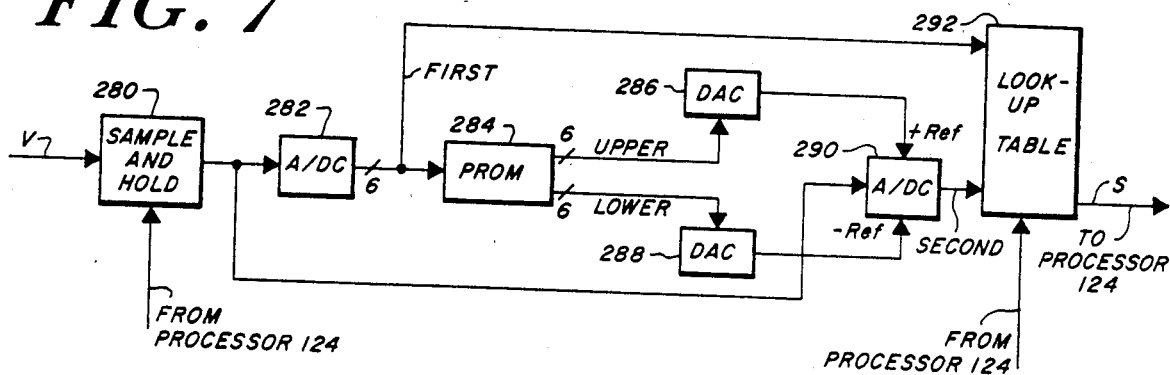
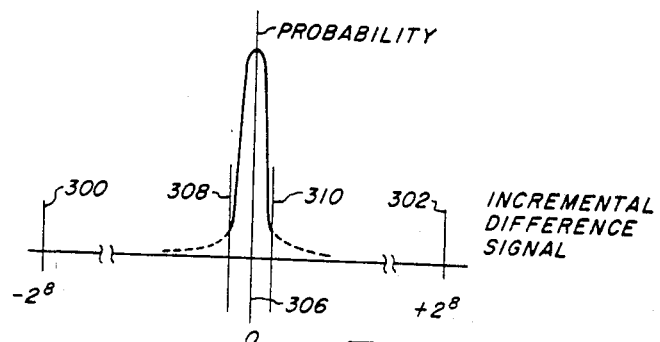
FIG. 8

DIGITAL X-RAY SYSTEM

The present application is related in subject matter to U.S. Pat. No. 4,458,267, entitled DIGITAL X-RAY SYSTEM, filed Oct. 6, 1981, of the same inventor.

FIELD OF THE INVENTION

This invention relates to radiology systems and more particularly to a system for storing, processing, and displaying image data derived from an x-ray image.

BACKGROUND OF THE INVENTION

Radiology systems are known in which a visible image is provided in response to the selective absorption of x-rays transmitted through a body from an x-ray source. In order to enhance the visible image or to derive information therefrom which is not readily perceived by viewing of the image, systems have been developed for storing data derived from one or more visible images and for processing the stored data to provide an enhanced display of the processed image data. In general, a visible image is provided on the screen of an image intensifier in response to received x-ray radiation, and a video camera is employed to scan the visible image and to produce a video signal which is processed to provide a display of the x-ray image, or stored for subsequent processing and display. Usually, a sequence of images is stored and processed to provide enhanced image quality and sufficient image data for comparative analysis.

The ideal system would provide a high quality displayed image for viewing and analysis in real time. Present systems do not achieve such ideal performance, since known systems which provide an image in real time or substantially real time suffer relatively poor image quality, while systems having good image quality require significant processing time in order to generate the displayed image.

SUMMARY OF THE INVENTION

The present invention provides a radiology system for storing, processing, and displaying two-dimensional image data derived from an x-ray image. The x-ray image is preferably in the form of a visible image or sequence of images provided by an image intensifier screen. A video camera is operative to scan the visible image and to provide an electrical signal representative of the intensity of each pixel area of each image, this electrical signal being digitized, encoded, and digitally stored. The stored data is processed and decoded to generate displayed visible images of the processed image data. The x-ray source can provide x-ray radiation of controllable intensity in response to changes in the electrical signal derived from the x-ray image. The electrical signal can also be processed to provide a measure of the average intensity of the x-ray image. The encoded signal is of a format to reduce the amount of data stored in memory, and temporal and spatial averaging and variable length coding are employed for efficient image data processing.

DESCRIPTION OF THE DRAWING

FIG. 5 is a graph showing the entropy associated with three analog to digital converter mathematical functions;

FIG. 6 is a graphical representation of the digitized signal in square root relationship to the input signal;

FIG. 7 is a particular embodiment of the square root converter of FIG. 6;

FIG. 8 is a graph showing the region of truncation for one embodiment of image signal compression;

DETAILED DESCRIPTION OF THE INVENTION

General System Configuration

Figure 1:
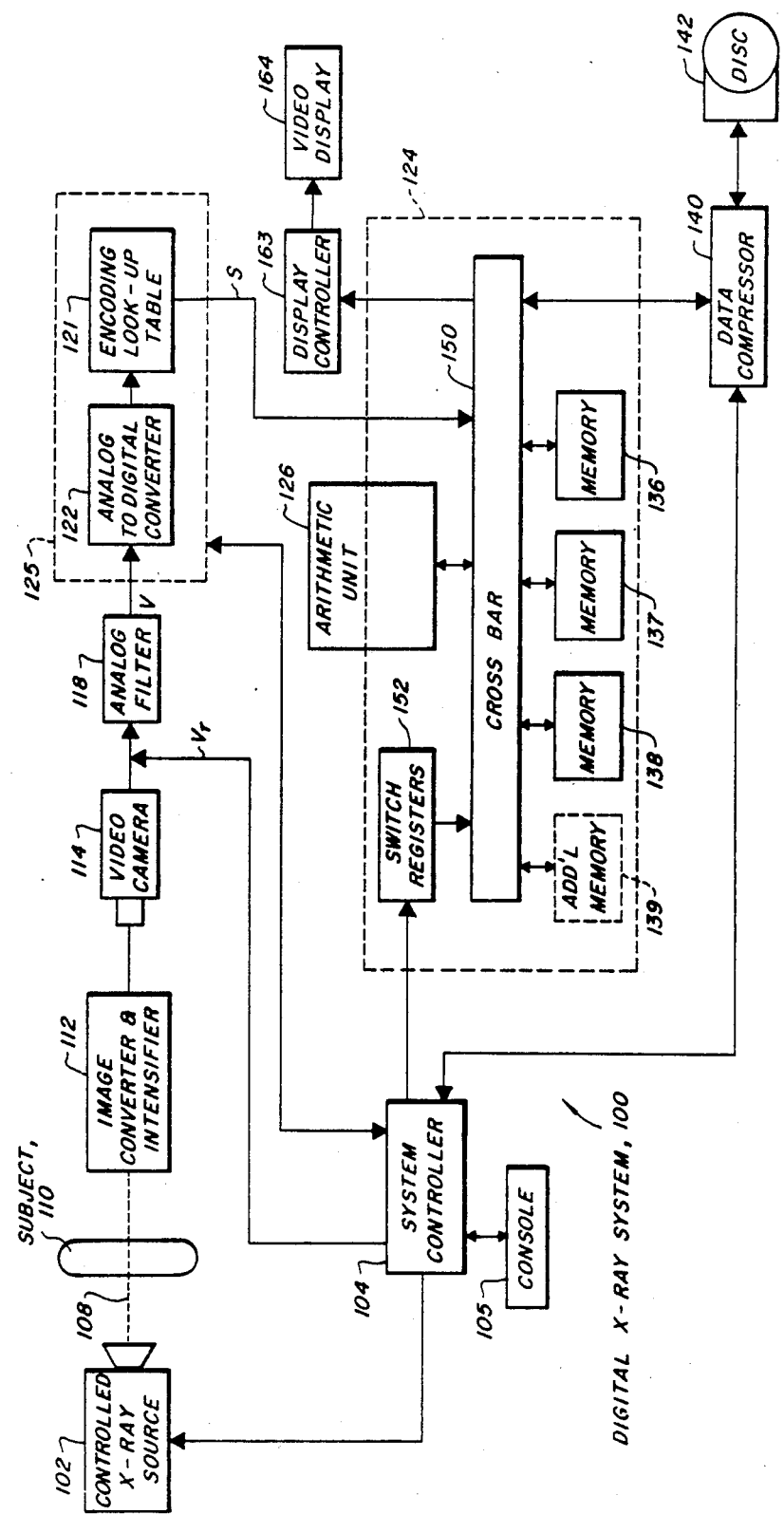
FIG. 1 is a block diagram of the system.

The general block diagram of the digital x-ray system 100 is shown in FIG. 1. The system comprises a controlled x-ray source 102 producing an x-ray beam (either continuous or pulsed) whose intensity is controlled. For standard x-ray tubes, the beam intensity can be controlled by adjusting the beam current by a signal from system controller 104. A system console 105 allows the system operator to the sequence of operation as desired, as well as specified operator or physician interaction, as discussed later. The controlled x-ray source 102 projects the x-ray beam 108 through a subject to be examined 110 and is received by an image converter and intensifier 112 which produces a visible image thereupon. The gain of the image converter and intensifier tube is adjusted to provide an improved signal-to-noise ratio for particular level of x-ray radiation received, the gain adjustment being inversely related to the x-ray radiation intensity. The visible image is converted to an analog video signal V by a video camera 114. The video signal is received by a low-pass analog filter 118 to reduce noise and eliminate aliasing. The filter 118 output is received by a combination analog/digital converter (ADC) 122 and an encoding look-up table 121. The look-up table 121 provides linearity correction for high brightness signals received by the video camera 114, converts the digitized signal to another format and provides calibration adjustment in concert with a known calibration signal generated by the system controller 104 and received by the analog/digital converter 122. In a generalized form, the converter 122 may have any format (or a format x) signal as an output, which is subsequentially converted to a square root value of the video signal V, linearized by encoding look-up table 121. The digital output signal from look-up table 121 includes a sufficient number of levels of digitization to sufficiently represent all necessary picture information without degradation, distortion or addition of unwanted noise, as further described below. The filter output signal is in turn received by a processor 124. The processor 124 includes an arithmetic unit 126 having a plurality of internal registers, and encoding and decoding data look-up tables and adders/subtractors and is connected to a memory 136, 137, 138, and 139 (memory 139 optional). All memories 136, 137, 138, and 139 are interchangeable and will alternately bear labels "buffer", "mask," and "image average," etc. according to the data stored therein. For instance, if an x-ray pulse is generated by x-ray source 102, and phased with some external event (such as a cardiac gating signal), and a progressive scan TV camera is used as the video camera 114, memory is used as a temporary buffer memory to provide as an output to both fields of the TV signal in phase with the operation of the system, which processes images in interlaced mode, at 30 frames per second. Also, data transferred to or from the disc 142 will be temporarily stored in the buffer memory. The processor 124 is controlled by a system controller 104 and crossbar 150 through switch register 152 wherein each interconnection path between the elements of processor 124 as well as the time arithmetic unit 126 is capable of being restructured on a frame-by-frame basis, typically at a rate of thirty times a second, depending on the particular process performed. These processes are discussed in relation to system phases, discussed below.

Figure 2:
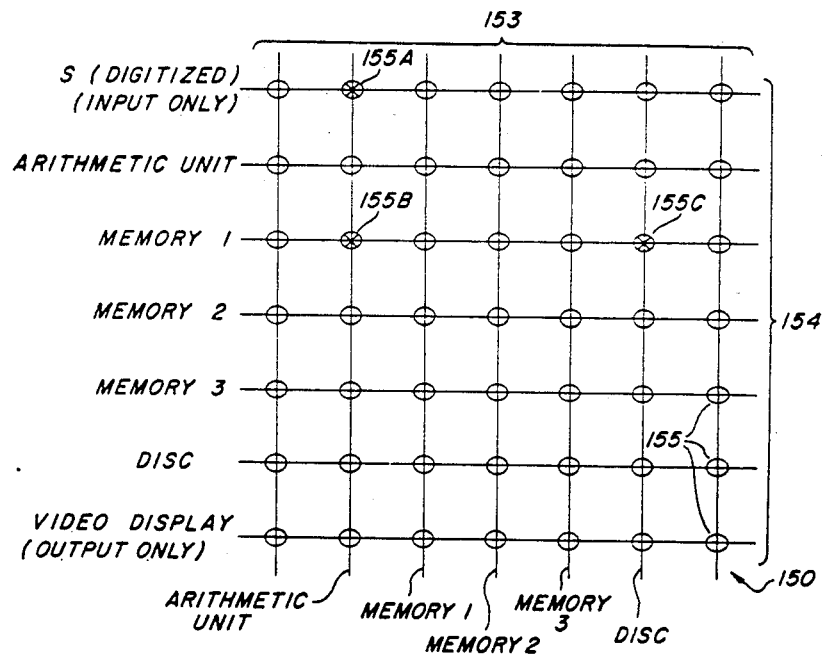
FIG. 2 is a crosspoint matrix illustrating the cross bar of FIG. 1.

The digitized signals are received by the processor 124 through cross-bar 150 including a signal input port 146. The processor 124, through its associated look-up tables, as well as the memories 138, 137, and 136 and the disc 142 through the data compressor 140, are interconnected by cross-point 150 to the signal input port 146 which form data paths. The cross-point 150, shown in FIG. 2, is a matrix of bidirectional data paths 153, 154 whose intersections include data switches 155 controlled by switch register 152 and system controller 104 shown in FIG. 1. All processing steps (shown by example later as steps in system Phases I-V occur at integer number of image frames, which occur 30 times per second, or once every 33 ms. Therefore, as data is transferred among the various system elements (including the signal input port 146, the arithmetic unit 126, the memories 136, 137, and 138, the disc data compressor 142 and the video display 164 through controller 163) the actuation of the respective switch for the respective processing step occurs at the frame rate, or 30 times per second. Each of the switched system elements is connected both to data paths 153 and 154, which permits additional paths to be provided when no connection conflicts (a conflict such as two elements communicating to one memory) exist. Additionally, the switch elements 155 are reed relay or appropriate solid state data switch elements known in the art. The processor 124 and its above-mentioned elements are discussed in greater detail below in relation to various interconnections of the system elements. Connection of the elements through the cross-point 150 will be mentioned specifically hereafter. The selection of the exact switch 155 such as 155A, 155B, or 155C is determined according to the desired path (shown in FIG. 2) between the respective elements. Several x-ray images are stored on a magnetic disc when the data is encoded, decoded and compressed by the data compressor 140, connected between the cross-point 150 and the disc 142. The signals stored on the disc 142 may be retrieved and restored for subsequent signal processing. The results of the system operation or particular intermediate steps are displayed on a video display unit 164 having a picture element (pixel) matrix of 512 by 512, or 1024 by 1024.

X-ray Intensity Control

In the operation of the above-described digital x-ray system, and in particular as applied to angiography, it is necessary to increase the contrast of the blood vessels over the background of the rest of the body tissue. Typically, the blood vessels are contrasted by intravenously injecting a radiation opaque solution, such as an iodine dye, into the bloodstream. The dye, while still a non-fully diluted mass, is called a bolus. When the bolus enters the area of interest, such as heart blood vessels, before the dye becomes fully diluted, the heart blood vessels are contrasted from the surrounding tissue. The x-ray image produced before the bolus arrives is proportional to the number of x-rays N, times the attenuation by the tissue $e^{-\mu}$, where $\mu$ relates the absorption of x-rays by the body tissue over the distance the x-rays travel in the body tissue and, in general, is used as a reference, or mask image M. The image $I_J$, during the bolus, is a product of the number of x-rays N and the absorption of x-rays by the dye in the heart blood vessels $e^{-\beta}$ and the tissue absorption $e^{-\mu}$ written together as $e^{[-\mu-\beta]}$. The preliminary mask image M is formed as an average during the time shown in FIG. 3 between the time periods marked 202 and 204, or at a particular time 203, or at a weighted average of times 205 and 207 as discussed in Phase IV of FIG. 14. Since (1) the images are a result of x-ray absorption by the tissue and the dye, and (2) the absorption is an exponential component, an image of higher contrast showing more useful information formed by subtraction of the two components of absorption ($\mu$ and $\mu\beta$) as $I_J-M$ or $\Delta_J$. The bolus increases in presence to a maximum intensity, thereafter decreasing at time period 206 in level to where it is circulated, absorbed and diffused to the remaining part of the body.

Figure 3:
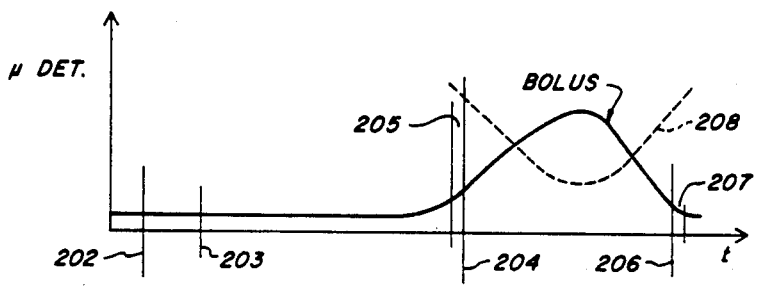
FIG. 3 is a time plot showing the absorption due to the bolus.

The definition of the difference ($I_J-M$) images $\Delta_J$ derived is improved according to the present invention by modulating the intensity of the x-ray source 102 according to a determination of the onset of the bolus in the cardiac area, typically as described by a transition point at 204 of FIG. 3. A fundamental constraint of the x-ray system operation is the maximum limit for radiation to be applied to the subject (over a given period of time) without causing skin damage and/or maximum power dissipation of the x-ray source cathode. It is observed that until the bolus arrives at the viewing area at time 204, the images produced earlier have a limited amount of useful information concerning blood vessels. Since the most useful information is derived during the period of the bolus (202 to 204) the period before the arrival of the bolus (202 to 204) can be adequately observed with reduced x-ray intensity without an unacceptable decrease in image quality. The analog signal V derived from the low x-ray intensity image sequence during interval 202-204 of FIG. 3 is normalized to yield comparable intensity with other images of different relative x-ray levels.

Therefore, according to the present invention, assuming a maximum average x-ray intensity from the x-ray source 102 over the period 202 to 206 of FIG. 2, a reduction of intensity over the period 202 to 204 permits an increase in x-ray intensity during period 204 to 206. Accordingly, a below average intensity of the x-ray source 102 is provided by system controller 104 before the onset of the bolus (202 to 204) and an above average intensity of the x-ray source is provided during the bolus (202 to 204) thereby increasing the difference image but without increasing the risks of overexposure.

During the first interval 202 to 204, the image derived from a reduced x-ray level is observed and measured by the system of the present invention whereupon a threshold image intensity level is calculated, the threshhold typically being the average intensity. At some time, shown typically as 204 (which varies in time according to the physical structure of the subject examined, the placement of the injection of iodine within the bloodstream, and other physical and circulatory parameters unique to each subject), the intensity of the images during that interval will reflect the occurrence of an increase in detected absorption ($\mu$); concurrently, the system controller 104 will compare the current image intensity with the calculated level, and provide a signal to the x-ray source 102 to increase the x-ray emissions to a level significantly above normal when the comparison shows the current image exceeding the calculated level. The increased x-ray intensity continues until the bolus diminishes, shown as the time 206, where the radiation from the x-ray source 102 may be diminished or terminated entirely.

As mentioned earlier, a base reference or mask image M is determined which is then subtracted from the image $I_J$ derived during the duration of the bolus. The averaging of all of the images produced during the period preceding the bolus (202 through 204) offers a deceptively attractive possibility of a large number of images; however, during this period which spans a significant time period, there is likely to be a substantial amount of patient or tissue movement, blurring or significantly altering the accuracy of the mask if derived from the average of all images during the time period 202 to 204. Therefore, in accordance to the present invention, one preferred area at which to derive the mask image M is at the onset of the bolus at the time 204. In one embodiment of the present invention, the first image produced from an elevated x-ray source emission level at the time 204 is defined as the mask image M. A mask produced in this manner has an improved image (of background tissue information) as a result of the higher intensity of the x-ray source 102, while at the same time having a minimal contribution from the radiation opaque substance in the blood system thereof.

Alternately, the mask image M can be derived from a minimum number of images $I_J$ (typically 8) which occur just before or just after the bolus, as shown in FIG. 3, 205 and 207, respectively. The optimum mask image M, to be used in postprocessing (described below) is derived from an average, in FIG. 3 at 208, of the images neighboring the bolus, properly averaged with the average value of the bolus itself.

The image produced by the image converter and intensifier 112 is converted to an analog video signal at lead 116 of FIG. 1 by a video camera 114 or other image-to-voltage conversion device to provide a voltage relating the particular image intensity of a given area on the image converter and intensifier screen. The video camera 114 in FIG. 1 provides output at 30 frames per second interlaced or 60 fields per second of the target 230 of the image converter and intensifier 112, each having a resolution of at least 483 visible horizontal lines (in a 525 line system) and a visible horizontal resolution of at least 512 points. The 1024×1024 pixel display would require a correspondingly greater resolution video display. Additional horizontal lines and scan intervals in the scan signal which would otherwise, in addition to the visible image provided by video camera 114 are included to provide the necessary timing and synchronization signals according to signal formats and described by standard video standards such as the NTSC American standard for the 512×512 pixel display. The system hereinafter described incorporates such standards as applicable but it is not necessarily limited thereto.

Moreover, additional image information, such as patient information serial numbers, user comments and location coordinates may be included in gray level scale somewhere on the screen.

The analog filter 118 comprises a low-pass 3-pole filter with a roll-off ($-3$ dB point) at $\frac{1}{2}$ of the digital sampling rate, which corresponds to a roll-off frequency of 5 MHz for 512×512 and 20 MHz for 1024×1024 pixel image. The filter 118 is incorporated to decrease noise and reduce aliasing errors. The particular circuitry for 3-pole low-pass filters are known in the art.

Digitization

The signal V from the output of the filter 118 is digitized into a word of bit length Z. The subsequent digital processor 124 (discussed below), display and storage elements place a high premium on the number of bits per sample of data (in terms of system price). It is therefore highly desirable to minimize the number of bits Z thereof for each sample of information. The bit length Z is to be minimized without any loss of the information contained in the signal V. The interval between one incremental value of the digitized code and the next, called the digitization interval $\delta$, must be small enough in comparison to the intrinsic uncertainty of the signal (mainly related to the photon quantum noise) to assure any information lost is below the noise level $\sigma_s$ of the uncertainty. The level of intrinsic uncertainty is selectable according to the particular system design chosen and is inversely related to the variable $\eta$. Therefore, the relationship between the level of RMS noise $\sigma_s$ of the signal V (or its transform S) is related according to the formula:

$$\sigma_s = \eta \delta \quad (5)$$

Furthermore, this relationship must exist over the entire range of the signal V. That is:

$$\sigma_{min,s}(V) \geq \eta \delta \quad (6)$$

or equivalently, $$\left[ \frac{dS(V)}{dV} \cdot \sigma_V \right] \geq \eta \delta \quad (7)$$

In the present invention, the digitized signal S is proportional to the square root of the analog signal V, $S = \sqrt{V}$, the relationship which, when differentiated and substituted in Equation 7, becomes $$\left[\frac{1}{2\sqrt{V}} \sigma_V\right] \geq \eta\delta \tag{8}$$

Assuming that the noise inherent in the analog signal V is mainly due the statistic of the photons which create the images from which the analog signal V is derived according to the equation $V=\alpha Ne^{-\mu}$, shown earlier, the noise $\sigma_V$ is defined as:

$$\sigma_V = \alpha\sqrt{Ne^{-\mu}} \tag{9}$$

which, when substituted in Equation 7 becomes:

$$\left[\frac{1}{2\sqrt{\alpha Ne^{-\mu}}} \cdot \alpha\sqrt{Ne^{-\mu}}\right] = \frac{\sqrt{\alpha}}{2} \geq \eta\delta \tag{10}$$

where $\alpha$ is a proportionality constant.

For the transformation $S=\sqrt{V}$, adopted in the present invention, $\sigma_s$ is independent of the value of the attenuation $e^{-\mu}$, i.e. constant over the range of analog signal V. This permits the technique of the present invention to minimized the number of bits Z (independent of the signal S) in direct relation to a given value of $\eta$. By linearly digitizing S (assuming $S=\sqrt{V}$) between its maximum value ($\alpha N$) and its minimum value ($\alpha Ne^{-\mu_{max}}$), the width $\delta$ is:

$$\delta = \sqrt{\alpha N} - \sqrt{\alpha Ne^{-\mu MAX}} \tag{11}$$

substituting into Equation 10, the relationship becomes $$\frac{\sqrt{\alpha}}{2} = \eta \cdot \frac{\sqrt{\alpha N} - \sqrt{\alpha Ne^{-\mu MAX}}}{2^Z} \tag{12}$$

which when solved for Z becomes:

$$Z = \log_2\sqrt{N} + \log_2\eta + [\log_2(1 - e^{-\mu MAX/2}) + 1] \tag{13}$$

The value of $\eta$ is selected to limit the additional uncertainty introduced by the digitization, called the quantitization error Q, to a predetermined value. Assuming that the distribution of the actual value of analog signal V with any digitization interval is uniform, the quantitization error Q (expressed as equivalent RMS noise) is:

$$Q = \frac{\delta}{2\sqrt{3}} \tag{14}$$

therefor, the total signal S uncertainty $\sigma_{S,D}$ (expressed in RMS equivalent noise) after digitization is:

$$\sigma_{S,D} = \sqrt{Q^2 + \sigma_S^2} = \sqrt{\frac{\delta^2}{12} + \eta^2\delta^2} \tag{15}$$

whereas before the digitization, $\sigma_S=\eta\delta$. The added relative RMS noise including the quantitization error is:

$$\frac{\sigma_{S,D} - \sigma_S}{\sigma_S} = \frac{\sqrt{\delta^2/12 + \eta^2\delta^2} - \eta\delta}{\eta\delta} \tag{16}$$

which for specific values of $\eta,(\delta=1)$ yields (in percent error): for $\eta=\frac{1}{2}$ $$\frac{\sigma_{S,D} - \sigma_S}{\sigma_S} = 0.1547 \text{ or about } 15\% \tag{17}$$

for $\eta=1$ $$\frac{\sigma_{S,D} - \sigma_S}{\sigma_S} = 0.0408 \text{ or about } 4\% \tag{17b}$$

for $\eta=2$ $$\frac{\sigma_{S,D} - \sigma_S}{\sigma_S} = 0.01036 \text{ or about } 1\% \tag{17c}$$

As mentioned above, the transformation $S=\sqrt{V}$ results in a minimum value of Z, primarily as a result of the independence of $\sigma_{S(V)}$ to the range of V in Equation 7. For other transformations of $S=f(V)$, such as those shown above, $\sigma_{S(V)}$ assumes different values over the range of $\mu$, and therefor of the analog signal V. Any linear digitization of the signal S results in excessive resolution of the digitized signal, where $$\sigma_{S,MIN} > \sigma_S,$$

for $S=f(V)$ as compared to $S=\sqrt{V}$ in the present invention. This excessive resolution obviously results in a higher value of Z. Alternate examples of the transformation $S=f(V)$ which may be compared to the Equation 13 for derivation of the value of Z, are shown below. For $S=V$:

$$Z = \log_2\sqrt{N} + \log_2\eta + [\mu_{MAX}\log_2\sqrt{e} + \log_2(1 - e^{-\mu MAX})] \tag{18}$$

For $S=\log_G V$:

$$Z = \log_2\sqrt{N} + \log_2\eta + [\log_2\mu_{MAX}] \tag{19}$$

Figure 4:
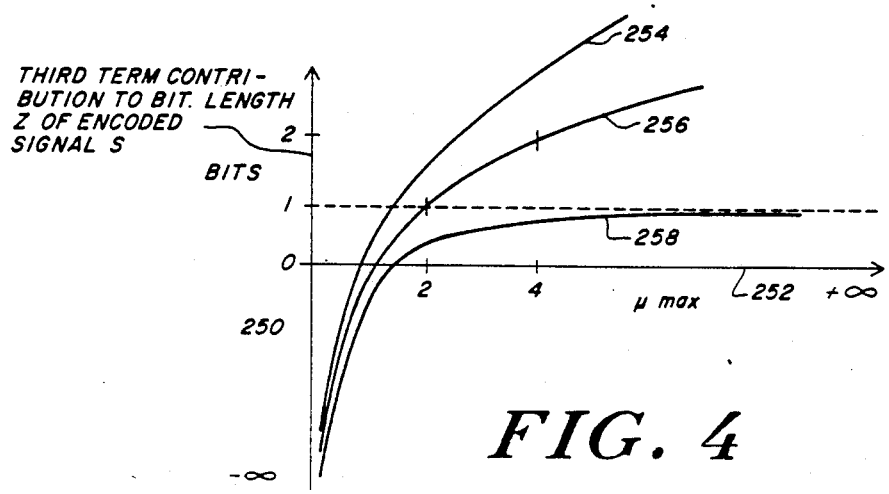
FIG. 4 is a graph showing the required additional number of digitization bits for three mathematical functions.

Since N and $\eta$ will be selected constants according to the design of the particular x-ray system, it can be easily shown that Z for these two alternate examples are always higher than the Z required for the transformation $S=\sqrt{V}$, over any range of the analog signal V. Moreover, as the dynamic range of the signal V increases, according to a greater difference in the absorption $\mu$, the size of the number of bits Z is bounded only for the transformation $S=\sqrt{V}$, as shown in FIG. 4. The size of Z varies significantly according to the third terms of the Equations 13, 18 and 19 which incorporate the value of $\mu_{max}$ into the mathematical relationship. The results of the third term of each respective equation is plotted along the vertical axis 250 wherein the value of $\eta$ is plotted along the horizontal axis 252. The third term contribution of the linear transform is shown by curve 254 wherein according to Equation 18, increases from minus infinity $(-\infty)$ for a $\mu$ of zero, and increases rapidly as $\mu$ increases. The contribution of the third term of the logarithmic transform shown in Equation 19 is shown by curve 256. This term provides a value which increases from minus infinity to a constantly increasing value as $\mu$ increases from zero to infinity. By contrast, the present invention incorporates a bit length whose third term contribution, as shown in the square root transformation of Equation 13, and demonstrated relative to a range of $\mu$ by curve 258. According to the present invention, the contribution to the number of bits Z required is bounded to a value less than one under all signal conditions or extremes of the value of $\mu$.

The analog video signal V from camera 114 of FIG. 1, filtered by filter 118 and subsequently encoded and compressed by system elements 121 and 122 and transformed into a digital signal S. The analog video signal V is converted to digital signals of a particular generalized format (format x) by converter 122 and encoded by encoding look-up table 121 so that the resulting digital signal accurately represents the incoming video signal under all operating conditions, with a minimum number of bits per converted sample. The two elements 121 and 122 may be combined in a single digitizer 125. In one embodiment of the present invention, the digitizer 125 of the x-ray system 100 shown in FIG. 1 typically includes an analog-to-digital converter 122 and 121 having a characteristic of producing a resulting digital signal equal to the square root of the incoming analog signal.

A graphical representation of the digitized signal S in square root relationship to the input voltage signal V is seen in FIG. 6. On the horizontal axis 260, two voltage signals are shown. The signal at the lower extreme of the voltage distribution 262 shows a much narrower peak relating the $\sigma$ of voltage distribution, thus (in the linear scale) requiring a higher number of bits for accurate representation. At the higher extreme, a voltage distribution 264 exhibits a broader voltage spun for the same number of $\sigma$. These signals are related to output signals along the vertical axis 266 according to a transfer curve 268 having the square root function. Therefore, it is seen that the narrow (linear) voltage distribution 262 is expanded somewhat to a distribution shown as 270, while the broader voltage distribution 264 (in the linear scale) is compressed somewhat and shown as the distribution of 272 so that the signal distribution 270 and 272, as well as the relative distributions of intermediate voltage signals, are expected to be of approximate constant width relative to the number of bits Z available to encode the respective digital signal V amplitude, while other compression or encoding techniques, such as the linear encoding, as discussed above, will require a greater number of bits Z per word to maintain an adequate representation of the narrow (and lower amplitude or higher $\mu$) voltage distribution of 262 of S while maintaining a dynamic range necessary for the voltages possible of the voltage distribution 264. Similarly, an alternate logarithmic relationship (S=$\log_G V$) requires a greater number of bits at the upper amplitude voltage distribution 264 (for lower $\mu$) of analog voltage signal V.

In particular, the square root digitizer of the present invention, under the conditions where (1) N$\approx$5000, (2) $\mu_{MAX} \approx 6.9$, and (3) Z is approximately 8, whereas a logarithmic digitizer would require Z=10 and a linear digitizer would require 12 bits per analog sample (per word), according to solutions of equations (13), (18) and (19), above.

A particular embodiment of the square root converter implementing the above-mentioned square root relationship between analog input and digital output shown now in FIG. 7.

The analog signal V is received by a sample and hold (S/H) 280 to provide a stabilized sample of V over the conversion period for each converted sample, the sample period in the present invention being about 100 nanoseconds. The stabilized sample signal from the S/H 280 is received by linear analog-to-digital converters 282 and 290, providing a first digital word (typically=6 bit) and a second digital word, respectively. The first digital word, which provides a general indication of the overall level of the signal S, is received by a programmable read only memory look-up table (PROM) 284 producing an upper digital code and a lower digital code, to be converted to an upper analog signal and a lower analog signal by digital-to-analog converter (DAC) 286 and 288, respectively. The upper analog signal and the lower analog signal is received by A/DC 290 as external upper and lower reference signals respectively, which permit the A/DC to convert the analog signal from S/H 280 to a digital output signal along a piece-wise linear transformation curve (approximately curve 268 of FIG. 6) having 64 linear segments corresponding to the 6 bit value of the first digital word ($2^6$=64).

Thereafter, the A/DC 290 second digital (output) word and the first digital word may be directly combined to form the square root representation (S) of the analog input (V), or both digital words are received by another PROM or random access memory (RAM) look-up table 292. The look-up table 292 provides a transform into alternate formats (beside S=$\sqrt{V}$), linearity correction for high contrast or brightness video signals and calibration adjustment. The calibration is provided by a predetermined analog input $V_t$ generated by the system controller 104, and received by the digitizer 125 or filter 118 while simultaneously reading the converted digital output produced by look-up table 292, which should directly correspond to the test signal $V_t$. Errors, corresponding to differences between the values of $V_t$ and the look-up table 292 output, are compensated by adjustments to the contents of the look-up table 292 by the system controller 104.

Image Storage

To provide useful angiographic information, the x-ray system 100 must preserve a number of images in sequence beginning prior to the onset of the bolus of interest, before the period between time 204 as shown in FIG. 3. Accordingly, the present invention can record at least six to eight images per second during the process. The analog video signals V, derived from the visible image, and square root encoded and digitized, are further compressed by the use of a variable length truncated Huffman code. In addition, before the Huffman encoding, the technique according to the present invention, the technique according to the present invention transforms a particular word $W_{JK}$ representing the pixel K of the image J into a new word $W^*_{JK}$ $$W^*_{J,K} = W_{J,K} - W_{J,K-1} - (W_{MASK,K} - W_{MASK,K-1}) \quad (20)$$

thereby recording the result of a double incremental difference, the first one between adjacent pixels of the same image (spacial compression of the information) and the second one being between this spacially compressed value and the corresponding compressed value of the mask itself (time compression of the information).

The spacial compression can be further improved by using more than one of the prerecorded pixels of the image itself, such as one of the neighboring pixels.

The mask preferred over any previously recorded frame for use in temporal compression of the information, for the following reasons. First, the system design is simplified. Second, the overall noise of the word $W_{JK}$ is reduced, as based under the assumption that the level of the noise of the element (pixel) of the mask has been significantly reduced by the proper averaging. Third, the image is accurately decompressed (exploded from compressed format) without altering the reference mask. Images are gathered and processed in this manner (including all of the above-mentioned methods of data compression) and sequentially stored on the disc 142 until the necessary number of images are recorded. The preferred media for digital image storage is a magnetic disc having a data transfer rate of at least $10^6$ information bytes per second (1 byte $\geq$ 8 bits) and capacity of up to 60 mega bytes.

A typical representation of the expected difference signal resulting from the subtraction operation thus described is shown in FIG. 8. Since each image $I_J$ has a possible $2^8$ or 256 different codes, the range of the incremental difference signal $\Delta_I$ extends for all the practical cases from $-2^8$, as shown at 300, to a $+2^8$ shown at 302 along the horizontal axis of the curve. Since most of the information on images will be slightly different from that of the mask, and further a very small incremental difference for adjacent pixels within the preceding subtracted image, most of the results of the image differences calculations will reside around zero (marked 306) having the high probability 304 shown as extending along the vertical (probability) axis. It is realized according to the present invention that the numbers having the higher probability (those having the higher value along the vertical or probability axis) be represented in an encoding scheme to have a fewer number of bits. Conversely, the signals of lesser probability would be represented by a longer code or bit sequence. This technique is known as variable length coding which includes Huffman codes known to the art. A possible troublesome consequence of Huffman encoding exists when an extremely low probability signal occurs, as may exist towards the signal extremes indicated at 300 and 302, such that the resulting Huffman code can be a seemingly very high number of bits for a single code value. Thus, for a signal of a finite resolution, a supposedly compressed encoded number may exceed the number of bits if the signal were directly recorded according to the present system. Therefore, the Huffman code is truncated at some point in the signal sample value (along the horizontal axis 312) to insure the maximum length of any H code does not exceed a given number (for instance 12). Two points labeled 308 and 310 relate to the negative and positive truncation points of the probability distribution 304. The system now operates in a manner to encode the values of input signals between the limits marked at 308 and 310 according to a particular Huffman code, and those signals which reside outside of the above-described interval, being between 300 and 308, and between 310 and 302, respectively, will be directly transferred in a bit-for-bit value in the storage disc media; without special encoding, an additional service word will also be recorded adjacent to the nonencoded signal, thus indicating the signal as being nonencoded.

Figure 16:
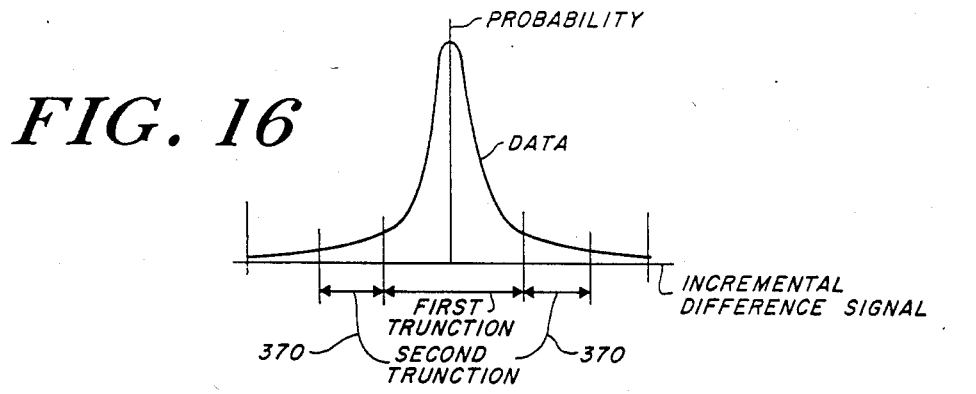
FIG. 16 is a statistical plot of the data showing truncation points thereupon.

Another truncation scheme can be implemented, as already known in the literature, in which the code of the portion 370 of FIG. 16 of the x axis are represented by a "double" Huffman code, the first being a service code defining the portion 370 (and belonging to the set of the untruncated Huffman codes), the second being a proper code belonging to the set of the untruncated Huffman codes.

Figure 9:
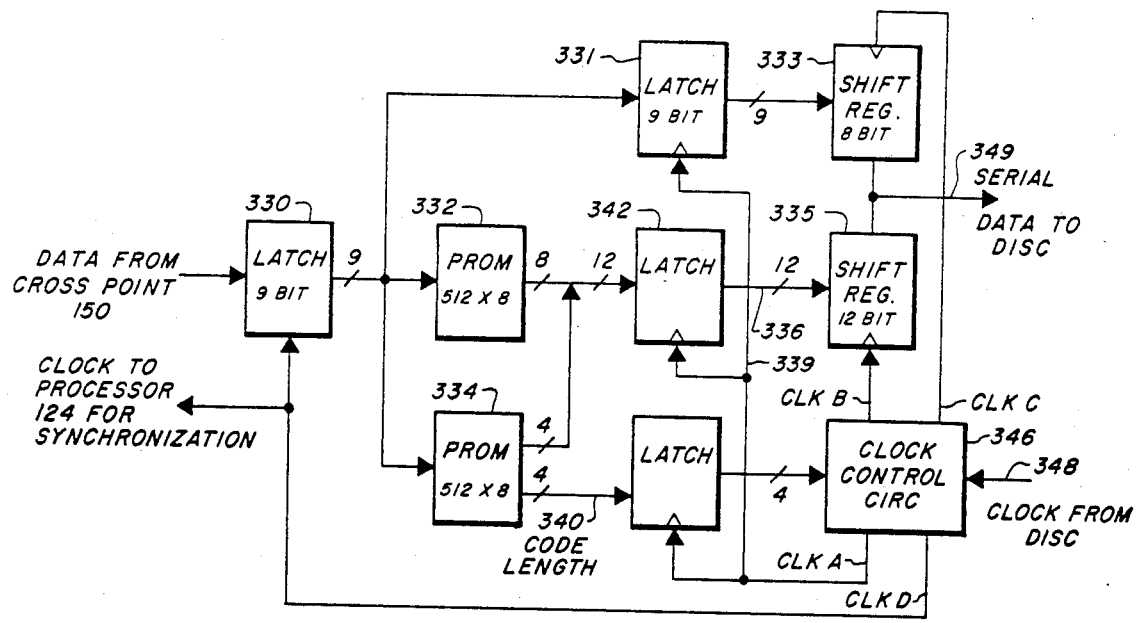
FIG. 9 is a block diagram of a Huffman encoder.

A typical hardware implementation of the Huffman encoding scheme is shown in FIG. 9 corresponds to the encoder part of data compressor 140 of FIG. 1, included therein. The incoming signal $W_{JK}$ is received by 9 bit latch register 330 according to clock signal D and in turn by the programable read only memory (PROM) 332 and 334. The PROM 332 serves as look-up table generating the most significant bits of the Huffman code, up to a maximum of 8, and the PROM 334 serves a look-up table generating the 4 least significant bits, if need, and an additional 4 bit code providing the information about the length of the actual H code generated. Therefore, the number of shift steps is defined by the lower 4 bits of the PROM 334 along output lead 340 and received by clock control circuit 346. The clock control circuit 346 produces a series of clock pulses, equal in length to the value of the shift interval produced on lead 340. This clock B signal is received by shift register 335 to produce a serial bit stream, of length equal to the number of clock B pulses, from the encoded word stored on latch register 342. The clock control circuit is synchronized to the disc data rate by disc clock signal received on lead 348. When a low probability input $W_{JK}$ data word value is detected, by PROM 332 and PROM 334, the PROM 332 outputs the service character (typically 3 bit code) into the latch 342, and, upon control of the clock A into the shift register 335, and, in the same time, the uncoded word $W_{JK}$ is transferred into the latch 331 and the shift register 333. Upon completion of this transfer, the control clock, as controlled by the special 4 bit length code received by the PROM 334, first sends 3 shift step to the shift register 335, and then 9 shift step to the shift register 333.

Figure 10:
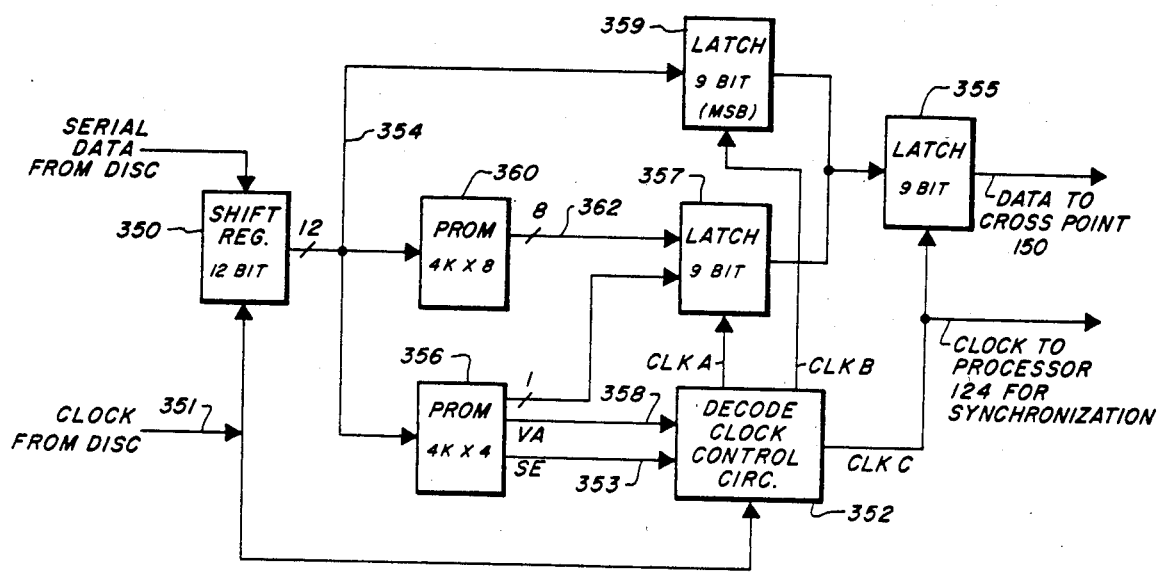
FIG. 10 is a block diagram of a Huffman decoder.

A block diagram of a decoder receiving the Huffman encoded signal is shown in FIG. 10 and is located within data compressor 140 of FIG. 1. The encoded serial bit stream is received by shift register 350 from the disc 142 of FIG. 1 according to disc clock signal on lead 351 at its data input. The shift register 350 provides a 12 bit parallel out data stream on lead 354 which is received by both PROM 356 and 360. When the stream of bits coming from the disc is shifted in such a way that the valid Huffman code is present with its most significant bits (MSB) at the first address of the PROM's 360 and 356, the PROM 356 sends the command VA to the clock control 352. The clock control thus latches in the latch 357 the undecoded 9 bit word $W_{JK}$, 8 bit of which are generated by the PROM 360 and the remaining one by PROM 356. The word $W_{JK}$ is then latched into the latch 355 and sent to the cross-point 150 by the output clock C of the clock control 352, whose output clock C also indicates that valid data are entering the cross-bar bus.

In case the valid Huffman code detected is, in fact, the 3 bit service character, indicating that the following 9 bits represent the uncoded $W^*_{JK}$, the PROM 356 output both VA and SE to the clock controller 352. Upon receiving VA and SE, the clock controller 352, transfer, via the command clock B, the 9 bits representing the uncoded word $W^*_{JK}$ to the latch 359, and then to the latch 355, as above. The control clock 352 also provides that during the next 12 shift steps, the clock A is not activated (whether or not the input is received by the PROM 360 and 356), thus preventing ambiguous situations, as may result during these 12 shift steps where the undecoded data words may be interpreted as a valid Huffman code.

It is important to note that the spatial and temporal compression techniques of the present invention result in a reduction of the entropy of the distribution of the signals of the information to be encoded, and that this reduction of entropy results in the lower bit rate of the information encoded, by making use of the variable length, truncated Huffman codes.

It is also important to note that the data to be encoded inherently contains a certain amount of noise, and that for this application is essentially due to the photon statistic.

Whereas the above-referenced temporal and spatial compression techniques result in a reduction of the entropy of the information in reference to a mask image M, such techniques are not able to result in any compression of the noise associated to the data, due to the structure of the noise itself which assumes independent values for each of the pixels.

In addition the temporal and spatial subtraction technique used to reduce the entropy of the information, will result in an increase of the noise of the data $W^*_{JK}$ to be encoded.

Specifically, for the word $W^*_{JK}$, $$W^*_{J,K} = W_{J,K} - W_{J,K-1} - (W_{MASK,K} - W_{MASK,K-1}) \quad (21)$$

the RMS noise $\sigma_{JK}$, will be:

$$\sigma^*_{J,K} = \sqrt{\sigma^2_{J,K} + \sigma^2_{J,K-1} + \sigma^2_{MASK,K} + \sigma^2_{MASK,K-1}} \quad (22)$$

Assuming that the noise of the words representing the pixel of the mask has been reduced to a negligible value by an averaging process, and assuming that the RMS noise is equal to $\sigma_N$ for all the pixels of the image J, it results:

$$\sigma^* = \sigma_N \sqrt{2} \quad (23)$$

The histogram of the words $W^*_{JK}$, shown in FIG. 8, has a variance $\sigma^2_H$, given by the relation:

$$\sigma_H^2 = \sigma_I^2 + \sigma^{*2} = \sigma_I^2 + 2\sigma_N^2 \quad (24)$$

in which the term $\sigma_I$ represents the variance of the theoretical histogram information and the term $2\sigma^2_N$ represents the additional variance due to the noise intrinsically carried by the information itself.

The entropy of the histogram of the words $W^*_{JK}$ can be quantified, under the hypothesis below, to be:

$$H_{W^*} = \log_2 \sqrt{2\pi e} + \log_2 \sqrt{\sigma_I^2 + 2\sigma_N^2} \quad (25)$$

Assumed are the following: first, the histogram of the word $W^*_{JK}$ has a gaussian shape. This is verified in practice for most cases; second, both $\sigma_I$ and $\sigma_N$ are expressed in number of digitization intervals $\delta$; and third, $\delta$ is not larger than $$\sqrt{\sigma_I^2 + 2\sigma_N^2}.$$

This is automatically verified from the fact the digitization used $\sigma_N \geq \eta \delta$ with $\eta \geq 1$.

It can also be noted that in most practical cases $\sigma_I$ is comparable to (in general lower than) $\sigma_N$, so that it results that the entropy of the histogram of the words $W^*_{JK}$, $H_{W^*}$, heavily depends upon $\sigma_N$, and, consequently, so does the efficiency of the compression process.

As a significant feature of this invention, it will be shown that encoding the data $W_{J,K}$ in square root format, a minimum value of the entropy $H_{W^*}$ efficiency of the compression process is granted.

In order to do so, a new parameter is defined $H_N$, which is the entropy of the noise associated to the words W:

$$H_N \triangleq \log_2 \sqrt{2\pi e} \cdot \sigma_N \quad (26)$$

It should be noted that the histogram of the words $W_{J_o K}$, for an image $I_{J_o}$, representing the same patient situation described by the mask itself, is:

$$H_{W^*}(I_{J_o}) = \log_2 \sqrt{2\pi e} \sqrt{2} \sigma_N = H_N + \tfrac{1}{2} \quad (27)$$

and this relationship provides a physical interpretation of $H_N$.

Furthermore, it is possible to write $H_{W^*}$ in a form that incorporates $H_N$ instead of $\sigma_N$. This form is as follows:

$$H_{W^*} = \log_2 \sqrt{2\pi e \sigma_I^2 + 2^{2H_N+1}} \quad (28)$$

and shows how $H_{W^*}$ depends upon $H_N$.

For the data W's encoded in square root format, the entropy is:

$$H_N(\sqrt{\phantom{x}} \text{ FORMAT}) = \log_2 \sqrt{2\pi e} + \log_2 \eta \quad (29)$$

For the data W encoded in linear format, the entropy is:

$$H_N(\text{linear format}) = \log_2 \sqrt{2\pi e} + \log_2 \eta + (\mu_{MAX} - \mu)\log_2 \sqrt{e} \quad (30)$$

For the data W encoded in logarithmic format, the entropy is:

$$H_N(\text{log format}) = \log_2 \sqrt{2\pi e} + \log_2 \eta + \mu_{MAX} \log_2 \sqrt{e} \quad (31)$$

FIG. 5 shows $H_N$ on axis 328 as a function of $\mu$ on axis 326 for the three formats log 326, linear 332 and square root 324. From the figure, it can be seen that the values of $H_N$ for the logarithmic format 326 and the linear 332 format, are higher in those portions of the range of the signal in which these format results in a digitization finer than needed, whereas, for the square root format 324, for which the level of the digitization is constant and can be kept at the minimum wanted level, over the entire range of the signal, $H_N$ is constant and minimum, over the range itself.

As a result of the above, the average bit rate per word b/W, encoded in the variable length, truncated Huffman codes, will heavily vary depending upon the format of the words to be compressed.

Assuming, as an example:
(1) $\sigma_I = 1$
(2) $\mu$ (average) = 3
(3) $\mu_{max} = 7$
(4) $\eta = 1$
(5) E (efficiency of the Huffman coding in reducing the bit rate per word close to the entropy of the data) = 1.10 the average bit rate per word of the compressed data, regardless of number of bits/word to be compressed, will be:

for data in square root format, b/W = 3.98;
for data in logarithmic format, b/W = 5.18; and
for data in linear format, b/W = 5.96.

Processor Configuration and System Phase Operation

The system general block diagram, as shown in FIG. 1, includes a processor 124 providing a multitude of image reconstruction filtering and processing functions, now described. The operation of the processor 124 is tailored according to the various processing functions. The processor 124 is reconfigured according to a cross-point 150 switch matrix including a plurality of switch devices forming a bi-directional data bus 145 between the system elements. The various elements of the processor 124, including the conversion look-up tables 128, 130, 132 and 134, contained within the arithmetic unit 126, and the buffer memories 138, 137 and 136 as well as data compressor 140, are engaged according to cross-point switch 155 within cross-point 150, shown in FIG. 2. The bi-directional data flow through the plurality of cross-point switch 155 comprise an arrangement providing the exchange of information among the plurality of units connected thereto, and is not necessarily limited to a particular or preferred form of hardware data connections or architectural distribution configurations.

The use of different formats of digitized data in different parts of the system provide cost savings without affecting the precision of the results beyond any wanted value. Also, it is possible to easily transform data through the use of look-up tables among different formats, as shown in Table I, each requiring a different number of bits, without any relevant loss of information.

TABLE I

| linear | to | $\sqrt{\phantom{x}}$ |
| --- | --- | --- |
| logarithmic | to | linear |
| logarithmic | to | $\sqrt{\phantom{x}}$ |
| linear | to | logarithmic |
| $\sqrt{\phantom{x}}$ | to | linear |
| $\sqrt{\phantom{x}}$ | to | logarithmic |

Relevant loss of information being defined as a maximum digitization error as compared to a given fraction of the intrinsic noise of the information regardless of how many times the unprocessed information changes its format. In fact, if a given number of different codes properly describes the information encoded with Z bits, that same given number of different codes will sufficiently describe the same information encoded with a higher number of bits. Specifically, when the look-up table converts data from a format of a higher number of bits to a format of a lower number of bits, it will convert some different [adjacent] codes in an identical code. The information filtered out from this conversion truncation will not affect the precision of the information beyond the wanted portion of the noise but rather can be related to the additional entropy of the signal noise. Conversely, when the look-up table converts data from a format requiring a lower number of bits to a format requiring a higher number of bits, it will convert one word in a unique word of higher number of bits, and all of which are required to bound the digitizing error to a wanted fraction of noise of the signal and at the other end of the range of the signal, one word in a word of higher number of bits, with a certain number of least significant bits arbitrarily set to a mid-point value between the adjoining values. It should be noted that setting those least significant bits to the mid-point value therefor results in a reduction of the entropy of the noise and therefor, the contribution of noise to the data. In a sense, the parameter $\eta$, previously defined, becomes a parameter of the entire x-ray system 100 and allow to optimally define the word size of the memories and of the register of the arithmetic units. Not shown in Table I, but within the scope of the present invention, are conversion look-up tables between the above-mentioned formats and other or general formats, also called x-formats.

The processor 124 operates in a plurality of phases, each defining a particular hardware configuration implemented by closure of the cross-point switches in the cross-point and such phases may be grouped into two basic categories: the first two phases are preprocessing phases wherein the information received from digitizer 125 output is processed while it is being produced in real time, and thereafter stored in either memory or disc storage device; and the remaining phases being defined as post-processing, wherein the information processed exists only in the recorded or stored memory devices. A typical sequence of phases from both groups is shown and discussed in connection with FIGS. 11-16 inclusive.

Each memory 136, 137 and 138 comprises at least a matrix 512×512 points, or picture elements (pixel). Each pixel stores data having 8 or more bits, giving the memory three dimensions 512×512×8 bits. Each group of 512×512×1 is called a bit-plane, thereby requiring at least 8 bit planes per memory. Each bit plane typically comprises four inch high density RAM memory integrated circuits, having a capacity of $64\times2^{10}$ bits. The four memory RAM used per bit-plane are read sequentially to form a horizontal sequence of pixels as the video image is displayed on the video display 164, which scans from left to right. Also, the sequential reading of each of the four RAM's per bit-plane into four different registers 412A, 412B, 412C and 412D of FIG. 11 allow the processor to perform the various phase operations in a pipeline sequence of four per arithmetic operations. The four pipeline registers 412A, 412B, 412C and 412D, collectively called 412, are used throughout the phase operations described below to permit the sequential reading of memory data into the arithmetic unit 126, and, for the purpose of brevity, will be included in the subsequent phase operations without specific description.

Similarly, pipelines and delay registers 411 provide sequential collection of process data for each of the four pipeline sequences, to permit the appropriately connected memory 136, 137 or 138 to receive and store the data. Additional registers 411A, 411B, 411C and 411D are included to permit the data to be shifted left or right by several pipeline sequence steps, which occur at the rate of pixel calculation and display ($\approx$10 MHz) to allow horizontal translation of the images (adjust picture registration) by selection of the appropriate number of registers to the left or right from which the memories receive data.

Figure 11:
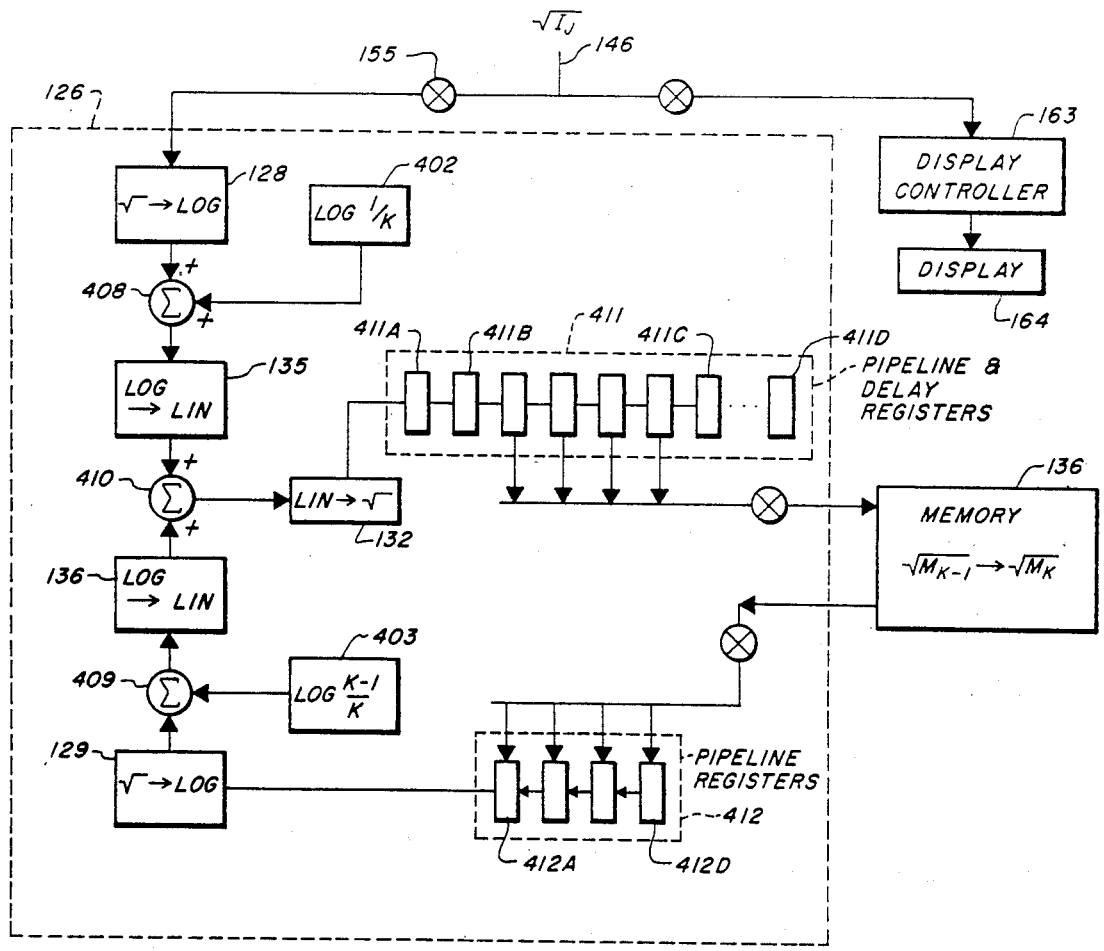
FIG. 11 is a block diagram of phase I of the system operation.

The first phase, as shown in FIG. 11, receives the digitized signal from the digitizer 125 at input port 146 into the processor 124. This lead comprises 8 bits of data which is directed to the square root to log look-up table within arithmetic unit 126 by engaging an appropriate cross-point switch 155 with cross-point 150. In addition, the image is displayed by display device 164 by engaging the appropriate cross-point switch, as above. The appropriate cross-point switch 155A, 155B, 155C and 155D is determined according to the intersection point of the data signal leads as shown in FIG. 2, and for the purpose of clarity, will not be otherwise specified. The image is viewed in the square root compressed data mode. The look-up table within arithmetic unit 126 provides a 12 bit output wherein it is stored initially by a register within the arithmetic unit 126. Registers are included within each element of the arithmetic unit 126 to receive the incoming data signals and store the resulting data signals as processed by each element of the arithmetic unit 126. The technique of storing or latching information in registers before and after such arithmetic operations is known, and for the purpose of clarity, the registers and their respective operations are implied, and will not be specifically mentioned hereafter. The mask memory 136 (or 137 or 138, if selected) stores all previous digitized image information which comprises the mask. When the first image is received by signal input port 146 of the processor 124, there is no mask image stored in the memory 136. However, thereafter, there will be the previous mask image stored therein. The previous mask is retrieved and received by the square root to log look-up table by engaging first the cross-point 150 and the pipeline registers 412. The look-up table converts the received square root signal to a 10 bit logarithmic signal. The converted logarithmic number from look-up tables 128 and 129 are multiplied by $$\frac{I}{K},$$

where K is the number of images stored and $$\frac{K-1}{K}$$

by adding the logarithmic equivalent of each, respectively in adders 408 and 409. In the case of the first image received, K would be equal to one. Thereafter, the signal is converted to linear format by look-up tables 135 and 136, and added at summation block 410. The resulting sum is converted to square root format by table 132 and shifted sequentially (according to the above-described pipeline operation) into registers 411A, 411B, 411C and 411D, to be read and stored by memory 136 as the most current value of the mask image M. When the mask image sequence is complete, that being a time period between 202 and 204 shown in FIG. 3, the averaging routine thus far described in accordance with Phase I is terminated and the mask memory 136 now contains an estimate of the mask value. This value is transferred to the disc 142 via the data compressor 140 which reduces the number of bits from 8 bits of information provided by the mask memory 136 to a variable length code having an average value of 3.9 bits per word, as discussed above in relation to Huffman encoding. The memory is connected to the data compressor 140 by appropriately engaging cross-point 150 to complete the data transfer path. The disc now stores a compressed representation of the mask being also encoded according to a square root representation.

Figure 12:
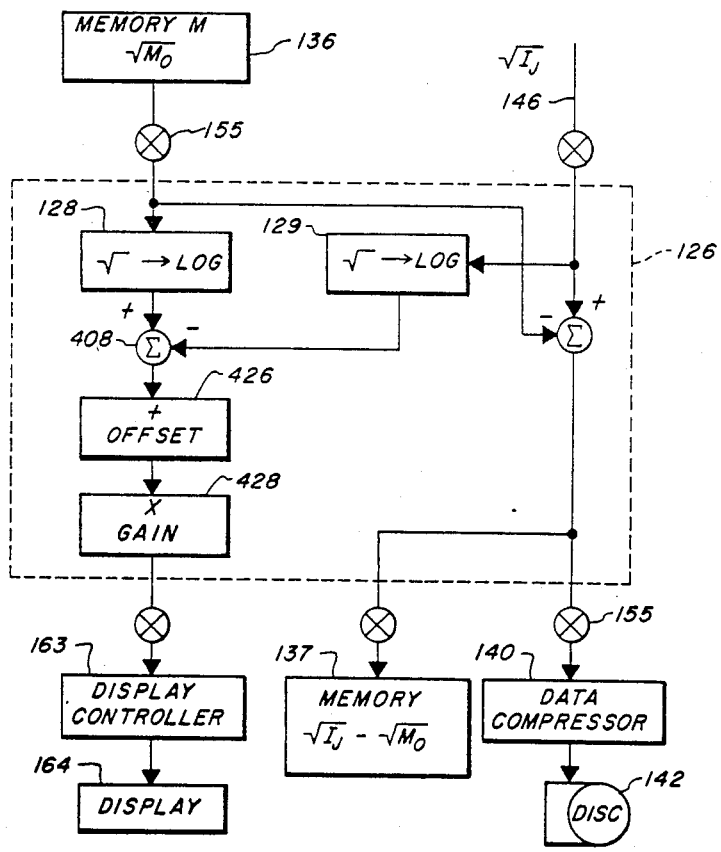
FIG. 12 is a block diagram of phase II of the system operation.

Phase II, as shown in FIG. 12, receives the images $I_J$ as encoded by the square root digitizer 125 at signal input port 146 of the processor 124. The 8 bit signal received on the signal input port 146 is thereafter transferred through the cross-point 150 to a look-up table 128 to produce a 10 logarithmic bit code to be received by the arithmetic unit 126. The mask memory 136, currently containing the value of the average mask, is connected to a square root to log look-up table 129 wherein the 8 bit square root signal is converted to a 10 bit log signal. The arithmetic unit performs a subtraction at the summer 410 to produce the difference between the mask image M and the images $I_J$ occurring after the onset of the bolus, to provide the contrasted images $\Delta_I$ showing the blood flow and the arterial system or other images as desired by the location of the unit on the subject. The resulting signal from the summer 410 is an 11 bit signal which is offset by an addition of a fixed value at 426 and multiplied by a predetermined value at 428 to provide an improvement in contrast. The 8 most significant bits of the resulting 11 bit number is connected to the display 164 by cross-point 150. The images $\Delta_I$ displayed are in the logarithmic format. Simultaneously, in Phase II, the 8 bit signal from buffer memory 138 is received by the arithmetic unit 126 in an unconverted format by engaging cross-point 150 to transfer the information to pipeline register 412. Similarly, the mask memory 136 produces the square root format of the old mask $M_o$ and transfers this information to pipeline register 413 (similar to pipeline register 412) of the arithmetic unit 126 by engaging cross-point switches 158 and 157. The resulting signals representing the square root format of the old mask $M_o$ and the current image $I_J$, are subtracted by summer 440. It should be noted that, due to the fact that the incoming frame $I_J$ encoded in square root format has only 8 meaningful bits, the 8 bit word size of the memory storing the difference between the incoming data and the mask $M_o$, is adequate to prevent any truncation error resulting in an information degradation beyond the wanted level of precision. The result is stored temporarily in pipeline and delay register 411. Thereafter, it is transferred through a memory 136, 137 and 138 to the data compressor 140 and the disc 142 by engaging switches in the appropriate cross-point 150. The disc thereafter will have a sequence of compressed mask image M, and difference of images—the old mask, both encoded by the square root format and the variable length coding incorporating both spatial and temporal encoding and therefor having an average value of 3.9 bit/word as discussed above in relation to the Huffman coding. The images thus stored on the disc typically are a subset of those generated by the x-ray system 100.

When the bolus has passed (206 in FIG. 3), the sequence of new images is complete and the preprocessing phases (I and II according to FIGS. 11 and 12) are complete. The post-processing mode is now begun.

Figure 17:
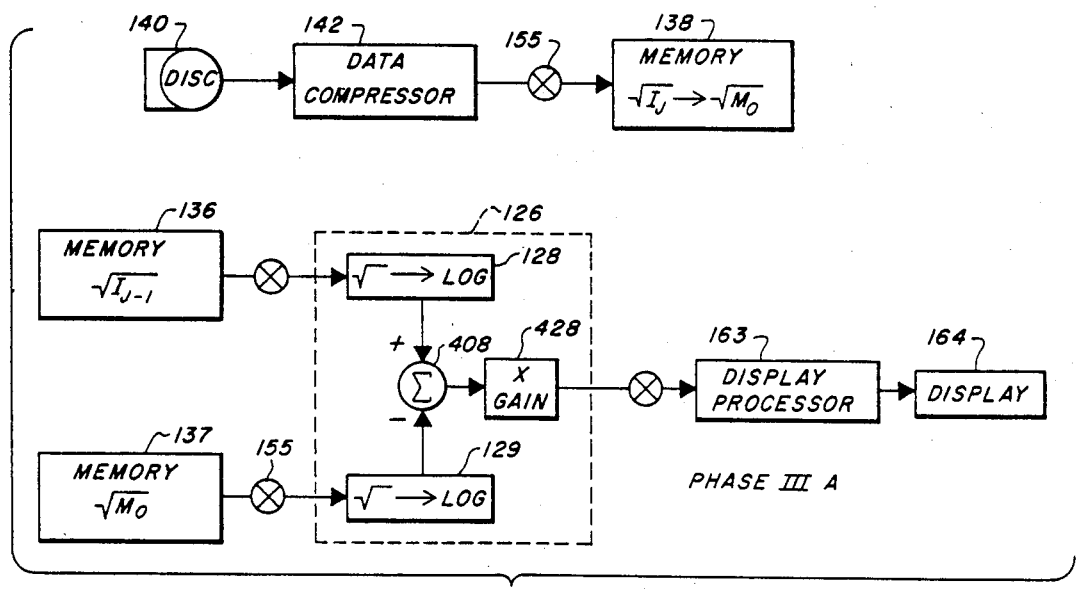
FIG. 17A shows an alternate configuration of phase III.
FIG. 17C shows a third alternative enbodiment of phase III.
Figure 17B:
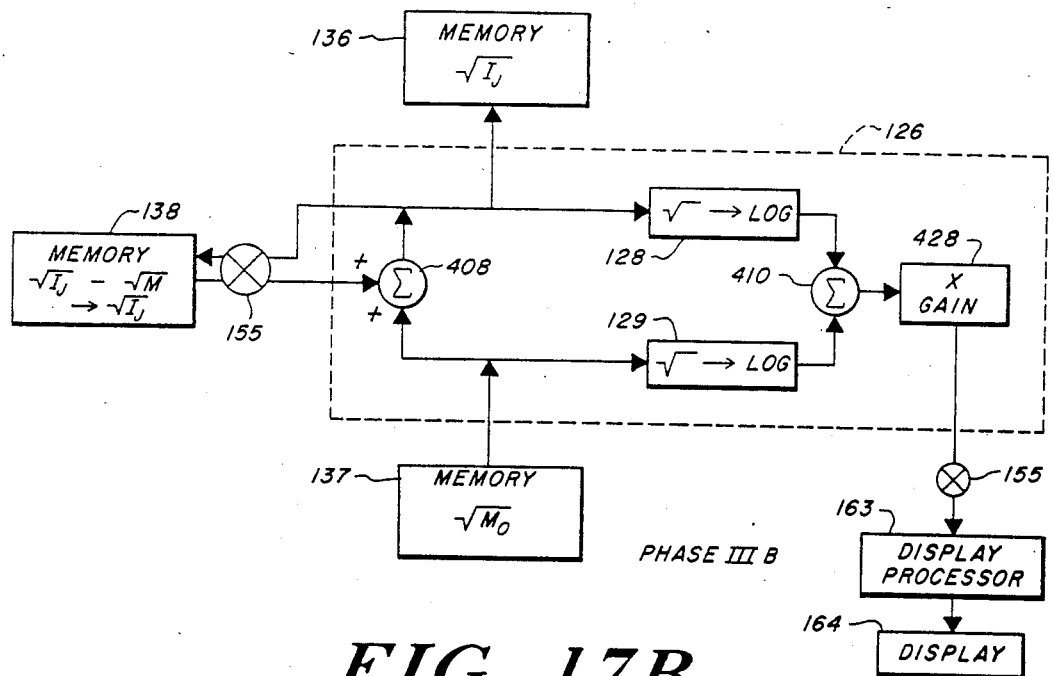
Figure 17C:
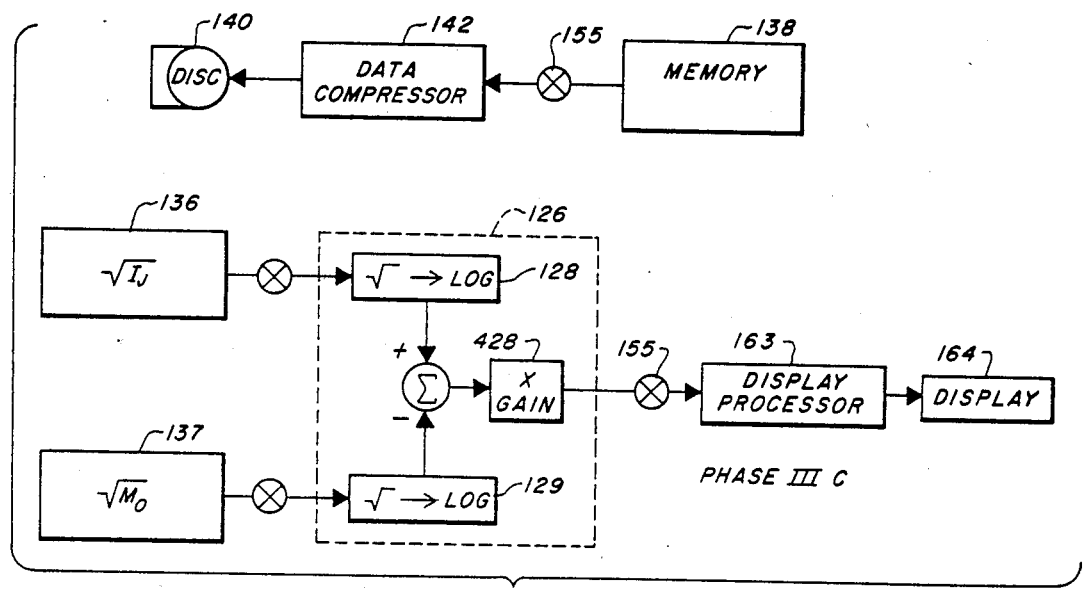

The first post-processing phase, Phase III, allows the replay of the frame of images $I_J$ previously stored on the disc, as difference images $\Delta_I$ (in log format) against the old mask $M_o$ (also in log format). The replay is performed, as shown in FIG. 17A, in such a way that the display shows the sequence of the differences $\Delta_I$ at a speed controllable by the operator, thus allowing a more careful analysis of the events as occurring during the process. More specifically, the frame or the differences can be frozen on the screen, under the control of the operator, as well as replayed backward. During this part of Phase III in FIG. 17B, the images, stored during the processing in the disc in compressed format as differences $I_J-M_o$ against the old mask $M_o$ are automatically added by adder 408 to the same mask $M_o$, thereafter, in FIG. 17C the images are sent to the date compressor 142 to be restored in the disc 140; as images $I_J$, in square root format, no longer dependent upon the old mask $M_o$. The images thusly stored in the disc 140 are only spacially compressed, no longer using the temporal compression technique. At the end of this Phase IIIc, FIG. 17C, the images stored in the disc, no longer dependent upon the old mask $M_o$, can be used to display any combination of them, depending upon the various software routines that can be stored in the system controller.

Examples of post processing combination of images are the following:

First, the choice of an alternate mask is made. After the operator has identified a difference image, which presents relevant diagnostic information as far as the presence of the bolus is concerned, but also presents some artifacts due to the modification of the background (for instance, due to some movement of the patient between the time interval across which the old mask and the intersecting image have been taken), the operator can fetch any other image stored in the disc, to be used as a new mask against which the interesting image is subtracted.

Second, the averaging of a new mask $M_N$ is performed. The operator may have identified a certain number of images $I_K$, all acceptable to be used as alternative masks. The operator can, at this moment, average the images $I_K$ to form a new mask $M_N$, which being an average of a certain number of frames $I_K$ will have a reduced noise, but also will show, when substracted to the interesting image, minimized artifacts due to the patient movement.

Third, time interval difference (T.I.D.) is performed. The operator can replay the sequence of images so that the screen shows the difference between the log of a frame image $I_J$ and the log of the frame image $I_{J-K}$, which is the image that has been stored on the disc during the processing, K steps before the image $I_J$. The values of K can be set by the operator. The sequence of these new images is known as T.I.D. post-process.

Fourth, automatically detecting the optimum difference image. Based on the calculation of average values of $\bar{\beta}_J$ per each frame, the system can be programmed to build two averages of the images $I_J$ stored during the presence of the bolus. The first average is built by weighing each image $I_J$ with a factor proportional to the average value of $\bar{\beta}_J$, and can be used as an optimal image. The second average is built by weighing each image $I_J$ with a factor inversely proportional to the average value of $\bar{\beta}_J$, and can be used as an optimal mask. In addition, after the Phase III is completed, the system can be programmed to modify an image $I_J$ fetched from the disc and stored in a memory into a modified image $I_J$ which is stored either in a different memory of the system or restored in the same memory. Examples of these modification are the following:

First, performing the reregistration of an image. The modified image $I_J$ consists the displacement of the image $I_J$ of any number of pixels along the x- and/or the y-axis of the display. The modified image $I_J$, can be used to eliminate or minimize the image artifacts arising from patient movement which have taken place between the detection of the mask and the detection of the $I_J$.

Second, digitally filtering an image. A high-pass (to enhance the edge) or a low-pass (to smooth out the image and reduce the noise) digital filtering of an image $I_J$, can be built and stored in a different memory of the system, by a sequence of translations, multiplication of the translated value by a factor (known as coefficient of the Kernell) and addition of the translated and multiplied value into another memory of the system, that, at the end, will store the filtered image.

Figure 13:
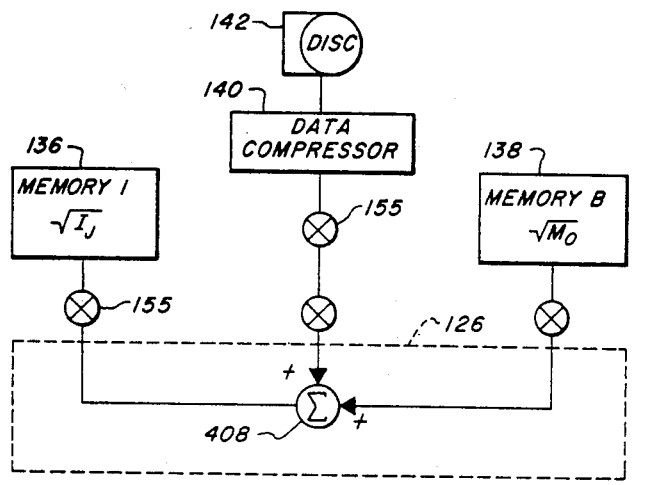
FIG. 13 is a block diagram of phase III of the system operation.
Figure 13:
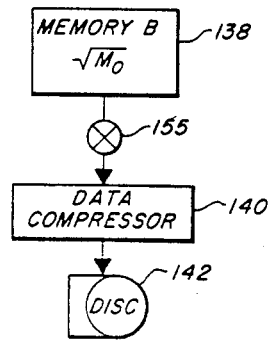

A specific example of the first post-processing phase, Phase III is shown in FIG. 13, which allows the frame F of image $I_K$ to be selected from among the stored images, either automatically from the onset of the bolus (point 204 in FIG. 3) backwards, or by choice of the attending physician. The selected image $I_f$ is stored in memory 136 through cross-point 150; the image, when stored, is subsequently transferred to the processor 124. The interactive operation with the physician is provided by coincidentially plotting over time, on the display 164, the average absorption ($\mu$) and the occurrence of low probability signals which are not compressed by a Huffman code in the data compressor 140 (as related according to the earlier discussion of FIG. 7) which therefor indicates a high degree of movement of the subject. This first signal is represented by the onset of the bolus as shown in FIG. 2. The physician or operator thereby observes a level of movement according to a proportional level of low probability signals (which are indicated by the number of service words recorded) during the moments preceding the onset of the bolus (point 204 in FIG. 3) and chooses the signal most stable having the longest period of low activity over which to average. The disc 142, currently having the compressed old mask value $M_o$, and the image difference signal $\Delta_I$, is decoded according to the data compressor 140 and received by the arithmetic unit 126 by engaging the appropriate switch 155 of cross-point 150. The data stored comprises a data word encoded according to the square root format. The buffer memory 138, having the mask image M stored thereon, is received through the cross-point 150. The resulting images are added by the summer 408 whose result is stored in memory 136.

Figure 14:
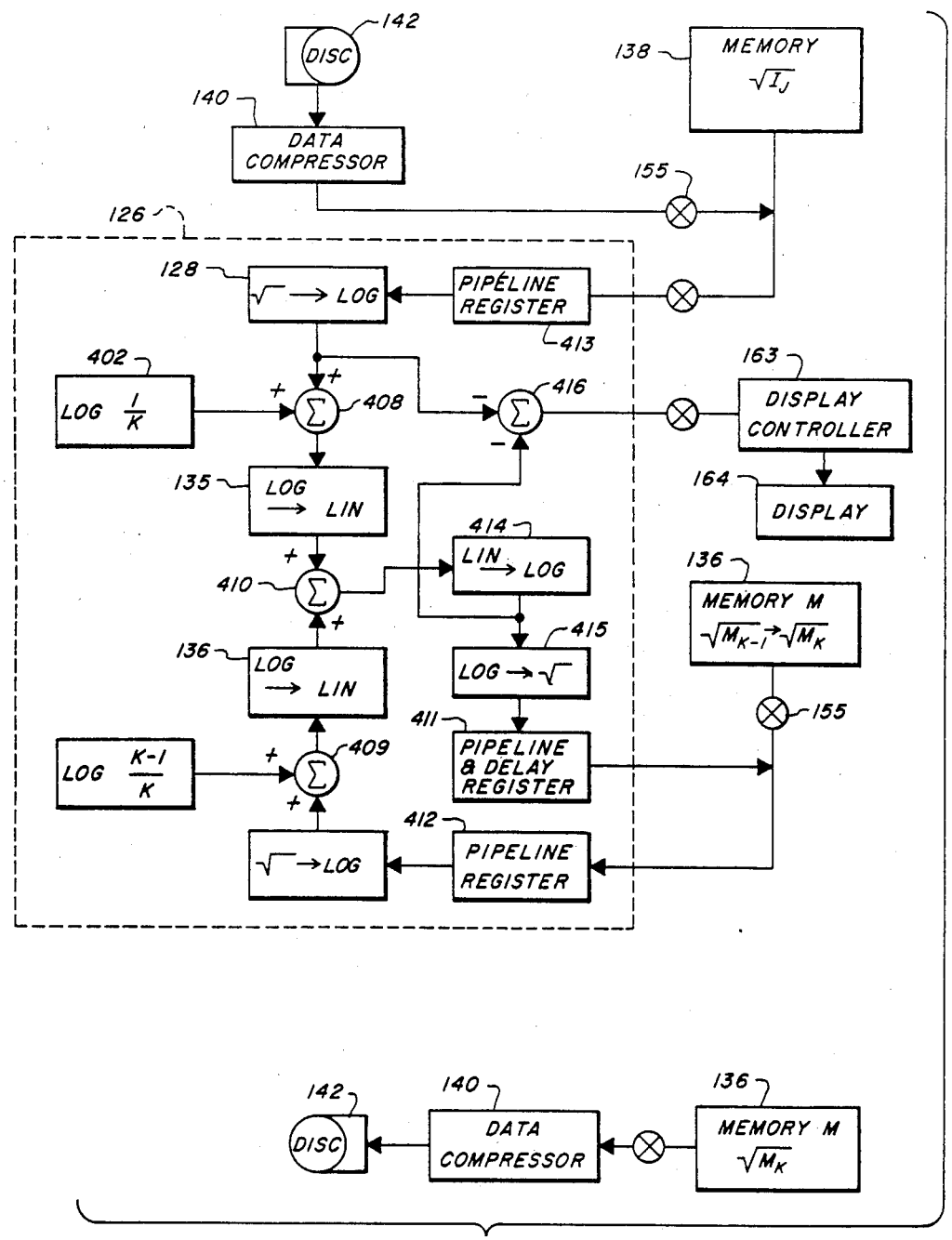
FIG. 14 is a block diagram of phase IV of the system operation.

The average value of the mask according to the current image is computed according to Phase IV shown in FIG. 14. The images stored in disc 142 are sequentially decoded by data compressor 140 and coupled to a pipeline register 413 of the arithmatic unit 126 and in turn, to a square root to log look-up table 128 of arithmetic unit 126. The look-up table 128 converts the 8 bit data word to a 10 bit data word. The previous value of the mask M is stored in the mask memory 136 and connected to a pipeline register 412, and in turn to a square root to log look-up table 129. The resulting 10 bit data words are added with the logarithmic equivalent of $$\frac{1}{K},$$

at 402, and $$\frac{K-1}{K}$$

at 403 by adders 408 and 409, respectively. The results are converted to linear signals by look-up tables 135 and 136, and added by adder 410. The results are converted to logarithmic values by look-up table 132, which value is in turn received by pipeline and delay register 411. The register 411 is connected to the memory 136 through cross-point 150. This current value of M is then stored in place of the previous mask value and the above-described cycle of averaging continues until the last image is processed in this manner. At that time, the mask memory 136 stores its value for the current averaged mask in the disc 142 as encoded by data compressor 140.

Figure 15:
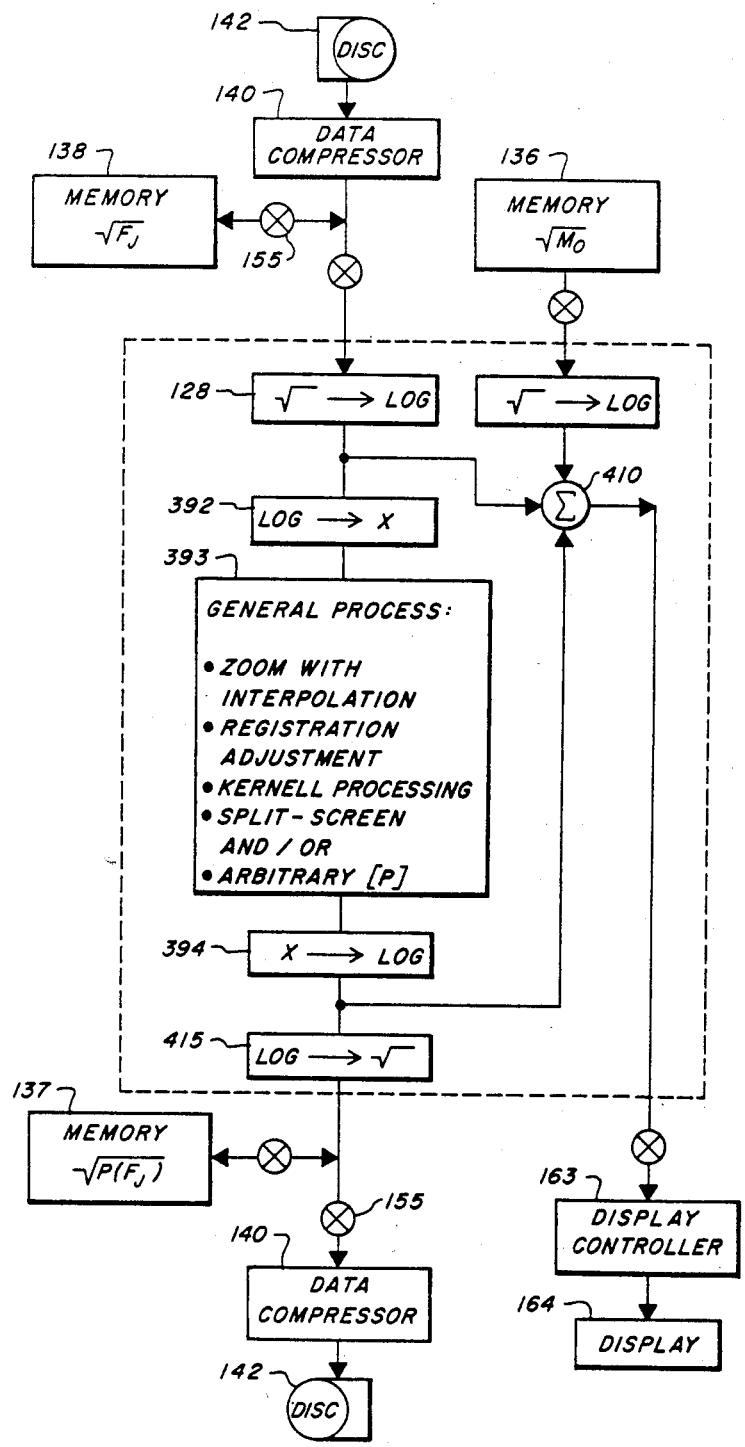
FIG. 15 is a block diagram of phase V of the system operation.

More generalized post-processing may be performed according to the sequence of Phase V shown in FIG. 15. A particular image $F_J$, stored on the disc 142, is decoded by decoder 140 and connected to mask memory 136 and is stored therein. The image $F_J$ in square root format in the mask memory 136, being either the image or the difference between the image and the mask, is converted to log format, and then to the desired format by the look-up table which may include any of the above-mentioned look-up tables by engaging the appropriate cross-point switch 155. The resulting multi-bit word is received by the arithmetic unit 126 to perform the particular generalized process P in the x-format as desired by the operator. The resulting signal is thereafter either viewed by display 164 through cross-point 150 or converted from the x-format again to the log and then to the square root format by appropriate converting look-up tables. The signal is thereafter coupled to the buffer memory 138 by engaging the corresponding cross-point switch 155. The signal stored by the buffer memory 138 represents the process function of the image $F_J$. The image therein stored may be displayed on the 512 by 512 display device 164. Alternately, the unprocessed signal and the processed signal, while in log format, are subtracted by adder 410 and connected to display 146 for system operator real-time observation of the processing P. The function or process performed on the image $F_J$ may be also stored on the disc 142 when compressed by the data compressor 140 by engaging the cross-point switch 154.

It is of note that the arithmetic unit 126 may be reconfigured according to the various phase drawings of FIGS. 11-15, 17A-17C as well as additional configurations according to known processor design techniques. These include additional registers, arithmetic functions such as multipliers, dividers and shift registers and other devices, as well as other data paths within the arithmetic unit 126 according to the design parameters of the particular digital x-ray processor constructed.

It is also within the scope of the present invention to include other modifications, additions and alterations as may be performed by one skilled in the art and are hereby incorporated into the present invention, which is not to be limited accept by the following claims.

What is claimed is:

1. A digitization system comprising:
means for providing an analog data signal including a noise component of known noise behavior as a function of the magnitude of the analog data signal; and
an analog to digital converter receiving said analog data signal having a digitization interval adapted to correspond to the noise behavior of said analog data signal noise component to provide a digital signal having a selected entropy uniformly related to the information content of the received analog data signal throughout the dynamic range of the signal.

2. The system of claim 1 wherein:
said noise behavior is described by the RMS noise, which is proportional to the square-root of the analog signal magnitude; and
said analog-to-digital converter digital signal corresponds to the square root of said analog data signal.

* * * * *